United States Patent
Adkisson et al.

(10) Patent No.: US 6,350,653 B1
(45) Date of Patent: Feb. 26, 2002

(54) EMBEDDED DRAM ON SILICON-ON-INSULATOR SUBSTRATE

(75) Inventors: James W. Adkisson, Jericho, VT (US); Ramachandra Divakaruni, Somers, NY (US); Jeffrey P. Gambino, Westford, VT (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/689,096

(22) Filed: Oct. 12, 2000

(51) Int. Cl.$^7$ ............................................. H01L 21/336
(52) U.S. Cl. .......................... 438/258; 43/275; 43/266; 43/149; 43/279
(58) Field of Search ................................ 438/243, 248, 438/257, 250, 258, 266, 275, 295, 149, 279

(56) References Cited

U.S. PATENT DOCUMENTS

| | | |
|---|---|---|
| 4,037,243 A | 7/1977 | Hoffman et al. |
| 4,499,558 A | 2/1985 | Mazin et al. |
| 5,517,038 A | 5/1996 | Maeda et al. |
| 5,532,957 A | 7/1996 | Malhi |
| 5,547,886 A | 8/1996 | Harada |
| 5,703,522 A | 12/1997 | Arimoto et al. |
| 5,740,099 A | 4/1998 | Tanigawa |
| 5,808,336 A | 9/1998 | Miyawaki |
| 5,894,152 A | 4/1999 | Jaso et al. |
| 5,959,927 A | 9/1999 | Yamagata et al. |
| 5,991,225 A | 11/1999 | Forbes et al. |

OTHER PUBLICATIONS

Sunouchi et al., "240 nm Pitch 4GDRAM Array MOSFET Technologies withX–ray Lithography", 1996 IEEE, pp. 601–604, IEDM 96.*

Lee et al., "Performance improvements in high density DRAM application using.15/spl mu/m body contacted SOI technology",SOI Conference 2000 IEEE International, , 76–77, Oct. 2–5, 2000.*

Kim et al., Advanced Integration technology for a high ly scalable SOI DRAM with silicon on capacitors, Electron Devices Meeting, 1996, International, 605–608, Dec. 8–11, 1996.*

IBM Technical Disclosure Bulletin—Selective SOI and Integration with Planar Oxide Isolated Bulk Devices, Oct. 1992, pp 196–197.

* cited by examiner

*Primary Examiner*—Charles Bowers
*Assistant Examiner*—Yennhu B. Huynh
(74) *Attorney, Agent, or Firm*—Schmeiser, Olsen & Watts; William D. Sabo

(57) ABSTRACT

A semiconductor device is presented which is directed to a method of forming embedded DRAM and logic devices, where the DRAM devices are formed in bulk, single crystalline semiconductor regions and logic devices are formed in silicon-on-insulator ("SOI") regions and where buried, doped glass is used as a mask to form deep trenches for storage in the bulk region. The resulting structure is also disclosed.

9 Claims, 4 Drawing Sheets

EMBEDDED DRAM ON SILICON-ON-INSULATOR SUBSTRATE

BACKGROUND OF THE INVENTION

1. Technical Field

The present invention relates generally to the field of semiconductor devices, and more specifically, to a semiconductor substrate having both bulk semiconductor areas and areas of silicon-on-insulator ("SOI"). The semiconductor substrate further contains embedded dynamic random access memory ("DRAM") and logic devices, where the DRAM devices have been formed in bulk regions and logic devices have been formed in SOI regions, and where doped polysilicon is used as a mask to form isolation and/or storage trenches in the bulk regions. The invention is also directed to methods of forming the structure thus described.

2. Related Art

Dynamic random access memory, or DRAM, is a type of semiconductor memory in which the information is stored as data bits in capacitors on a metal-oxide-semiconductor ("MOS") integrated circuit. Each bit is typically stored as an amount of electrical charge in a storage cell consisting of a capacitor and a transistor. Due to charge leakage, the capacitor discharges gradually and the memory cell can lose the information. Therefore, to preserve the information, the memory must be refreshed periodically. Despite this inconvenience, the DRAM is a very popular memory technology because of its high density and consequent low price.

Conventional semiconductor DRAM devices are formed in bulk semiconductive substrate material by implanting a well of either p-type or n-type material in a wafer of either type material. Gates and source/drain diffusions are then manufactured using commonly known processes. These can form devices known as metal-oxide-semiconductor field effect transistors, or MOSFETs. When a given chip uses both p-type and n-type semiconductors, it is known as a complementary metal oxide semiconductor ("CMOS") chip. Each of these type devices must be electrically isolated from the others in order to avoid electrical shorting of the circuits. A relatively large amount of surface area is needed for the electrical isolation of the various FETs, which is undesirable in the current trends towards overall size reduction and greater integration. Additionally, parasitic paths and junction capacitance problems may be present because of the source/drain diffusions' physical proximity to other FETs and to the bulk substrate. These problems more frequently arise when trying to scale circuitry down to the sizes necessary for greater circuit density.

Silicon-on-insulator ("SOI") technology has been increasingly used to alleviate these problems. However, SOI suffers from problems of self-heating, electrostatic discharge susceptibility, low breakdown voltage, and dynamic floating body effects, which in turn present problems for passgate devices and devices requiring tight threshold voltage control. The so-called "floating body effect" occurs when the body of the device is not connected to a fixed potential and, therefore, the device takes on a charge based on the history of the device. The floating body effect greatly affects device reliability.

Some types of semiconductor memory are more susceptible to the floating body effect. For instance, in dynamic random access memory ("DRAM") the information is stored in capacitors in an MOS circuit. Therefore, in DRAM, the floating body effect is especially detrimental since it is critical that the associated transistor stays in an "off" condition to prevent charge leakage from the storage capacitor.

Another problem specific to SOI is that the formation of large value capacitors (e.g., for decoupling applications) is very difficult because a specific purpose of SOI is to reduce junction capacitance. Since SOI diffusion capacitance is small relative to bulk technologies, use of diffusions to obtain decoupling capacitance is impractical with SOI.

Accordingly, a need exists for combining areas of SOI for high performance support devices, with adjacent bulk devices for low leakage memory arrays.

SUMMARY OF THE INVENTION

The present invention discloses a bulk/SOI hybrid semiconductor substrate which contains embedded dynamic random access memory ("DRAM") and logic devices, and wherein the DRAM devices have been formed in bulk regions and the logic devices have been formed in SOI regions, and where doped polysilicon is used as a mask to form isolation and/or storage trenches in the bulk regions. The invention is also directed to methods of forming the structure thus described.

The present invention provides a semiconductor apparatus comprising: a single crystalline substrate having a substantially planar surface; a first surface area on the planar surface having a semiconductor-on-insulator region; a second surface area on the planar surface being a single crystalline bulk region; embedded logic devices formed in the silicon-on-insulator region; embedded memory devices formed in the single crystalline bulk region; and storage trenches within the bulk region.

The present invention additionally provides a semiconductor apparatus comprising: a single crystalline substrate having a substantially planar surface; a first surface area on the planar surface having a semiconductor-on-insulator region; a second surface area on the planar surface being a single crystalline bulk region having substantially the same crystalline structure as the planar surface; at least one deep trench in the single crystalline bulk region; an array of memory devices constructed in the single crystalline bulk region; at least one logic device constructed on the first surface area on the planar surface; electrical contacts connected to each memory and logic device; and an insulative material deposited upon the first surface area.

The present invention also discloses a method for forming a semiconductor apparatus, comprising the steps of: providing a single crystalline substrate having a substantially planar surface; forming a silicon-on-insulator region on a first surface area of said planar surface; forming a single crystalline bulk region on a second surface area of said planar surface; forming embedded logic devices in said silicon-on-insulator region; forming embedded memory devices in said single crystalline bulk region; and forming trenches in the single crystalline bulk region.

BRIEF DESCRIPTION OF THE DRAWINGS

For an understanding of the present invention, reference should be made to the following detailed description taken in connection with the accompanying drawings wherein.

DETAILED DESCRIPTION OF THE INVENTION

The present invention discloses a method for making an embedded DRAM array on a silicon-on-insulator substrate, and the resulting apparatus.

Figure 1:
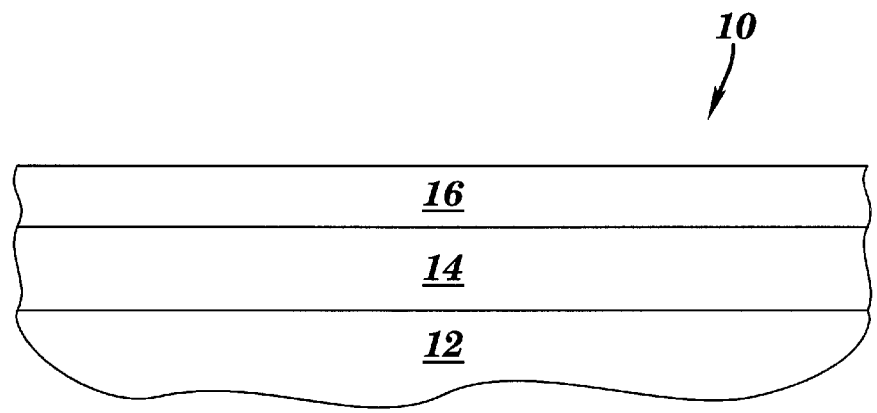
FIG. 1 is a cross-sectional schematic of a first step in practicing the method of the present invention.

Referring to FIG. 1, a standard silicon-on-insulator ("SOI") substrate is provided. The standard SOI is a single crystalline semiconductor substrate 10 having a substantially planar upper surface, and which includes an insulative oxide layer 14 and a thin semi-conductive layer 16 in a first surface area on the planar surface, and a crystalline bulk region 12. The crystalline bulk region 12 is a single crystalline region having substantially the same crystalline structure as the planar surface. The insulative oxide layer 14 is typically a silicon oxide. The crystalline bulk region 12 is a single crystalline semiconductor material that is usually silicon. The substrate may be manufactured in a number of different ways including: silicon implanted with oxide ("SIMOX") in which a bulk wafer is high-energy-implanted with a large dose of oxygen; bond-and-etch-back ("BE-SOI"), in which two bulk wafers have an oxide grown on a surface and a dopant profile is incorporated in one of the wafers to act as a marker layer, the two oxide surfaces are bonded together and then one of the wafers is etched back to the marker dopant layer; or a method known as "smart cut" in which one of the wafers is hydrogen implanted before the first wafer is bonded to the second wafer, then the two are bonded together and the excess silicon of one of the wafers is cracked off using the hydrogen in the silicon structure to cause the cracking in the proper level; or by any other suitable means of making SOI.

Figure 2:
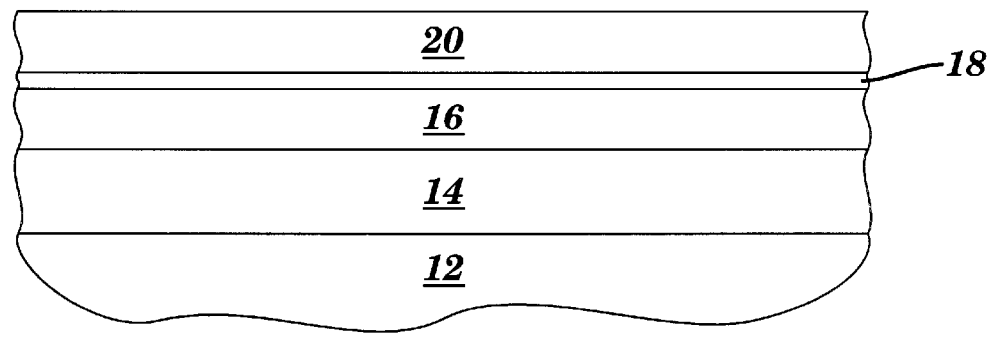
FIG. 2 is a cross-sectional schematic of a second step in practicing the method of the present invention.

Once the SOI substrate has been formed, a thin pad oxide layer 18 (see FIG. 2), typically in the range of from about 5 nm to about 10 nm, of silicon dioxide is deposited or grown on the thin layer of silicon. A polish stop layer, in this case a silicon nitride layer 20, typically about 100 nm thick, is then deposited on the thin pad oxide layer 18.

Figure 3:
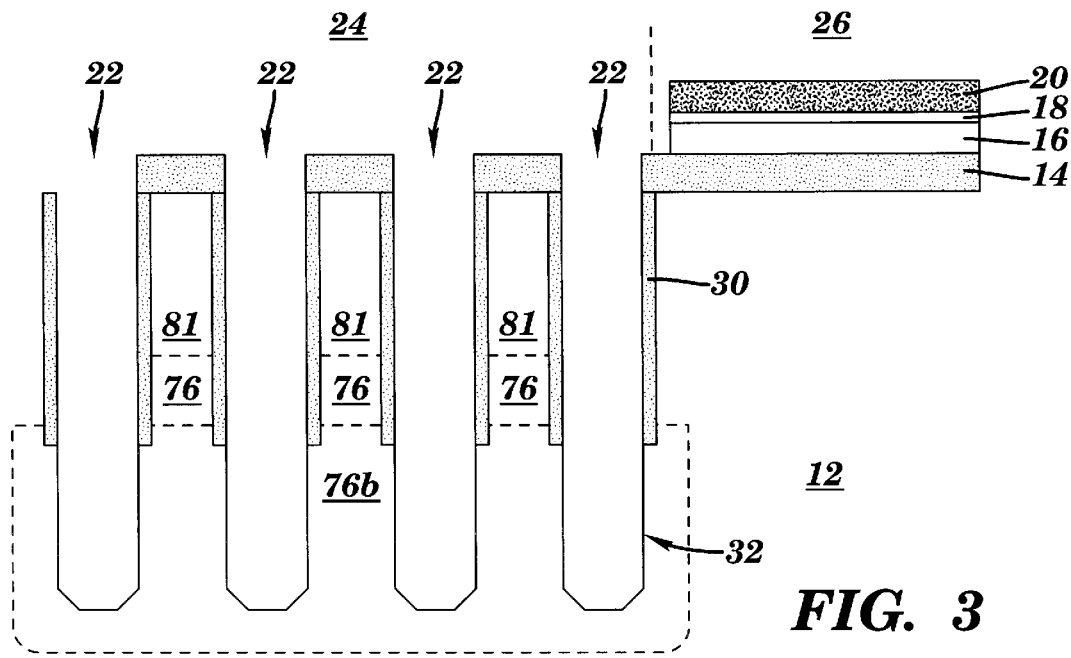
FIG. 3 is a cross-sectional schematic of a third step in practicing the method of the present invention.

As shown in FIG. 3, the crystalline bulk region 12 is divided into two regions; a first portion of the crystalline bulk region which will become a DRAM array 24, and a second portion which will become an SOI area 26, which will contain the supporting high-performance logic CMOS devices. A portion of the DRAM array 24 is further processed into an area of deep trench isolation using conventional processing techniques. The area of deep trench isolation is delineated into an array wherein the DRAM devices will eventually reside.

The deep trench formation process begins with the removal of the pad film layers (i.e., the pad oxide layer 18, the silicon nitride layer 20), and the SOI layer 16. A p-type well 81 is formed in the diffusion region 43 using known techniques (FIG. 3). Next, a borosilicate glass("BSG") layer (not shown) is used to pattern the deep trenches 32. The BSG is planarized, which smooths the 250 nm step at the edge of the DRAM array, making it easier to perform the lithography used to pattern the deep trenches 32. Deep trench openings 22 are formed, using conventional methods, which extend through the BSG layer and the oxide layer 14, and which continue into the crystalline bulk region 12. These trenches 32 are typically formed by photolithographically defining the area using a photoresist material (not shown) and then etching the defined area. The materials are etched through the BSG layer and the buried oxide ("BOX") layer 14, and the etching stops on the top of the crystalline bulk region 12. These openings will form the array blocks in a DRAM product or the like. The insulative layer 14 of silicon dioxide remains as a buried oxide layer 14 after the BSG layer is stripped away, due to the wet etch selectivity between the BSG layer and the insulative layer 14.

Each deep trench 32 is provided with a collar 30. Each collar 30 is formed of insulative silicon dioxide material. After the collar is formed, an n+ buried plate 76b is formed by diffusion of arsenic (As) or phosphorous (P) into the bottom of each deep trench. A thin node dielectric (e.g., 2 to 10 nm) of silicon dioxide ($SiO_2$), silicon nitride (SiN), or silicon oxynitride (SiON) is formed in the trench. This is the dielectric for the trench capacitor.

Figure 4:
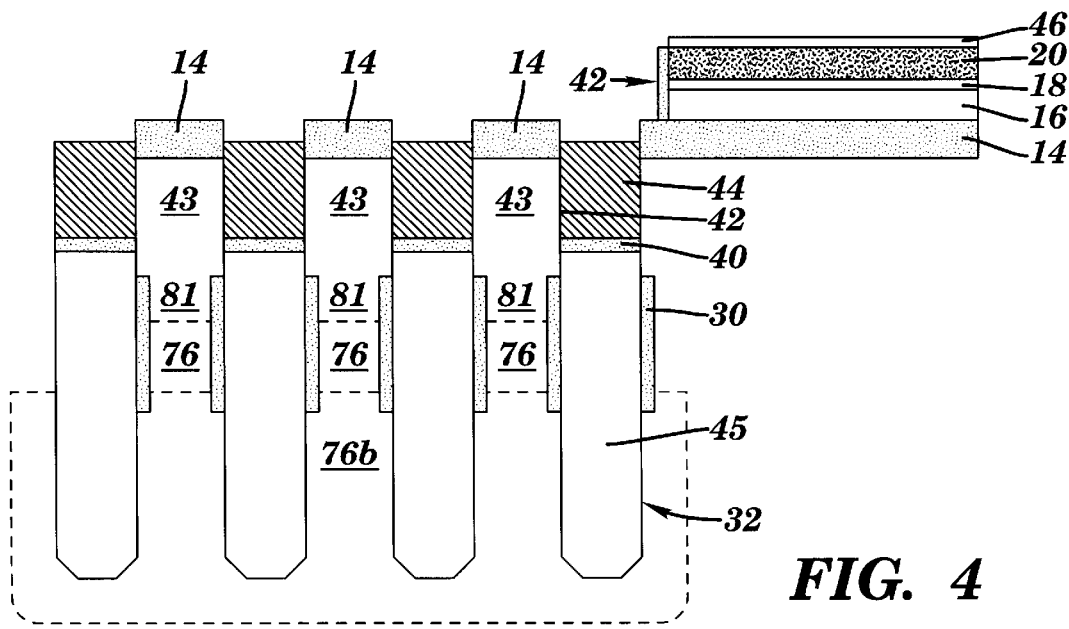
FIG. 4 is a cross-sectional schematic of a fourth step in practicing the method of the present invention.

The formation of the remainder of the storage capacitors and the vertical gates in the DRAM array 24 is next performed, as illustrated in FIG. 4. All of the deep trenches 32 are filled with doped polysilicon 45, which serves as the inner electrode of the trench capacitor. The layer of doped polysilicon 45 within each deep trench 32 is then recessed. The top part of the collar is removed with a wet etch (e.g., using hydroflouric acid (HF)), strap connections between the doped polysilicon 45 and the crystalline bulk region 12 are formed, and a trench top oxide ("TTO") layer 40 is deposited upon each recessed doped polysilicon layer 45. A gate oxide is introduced into each diffusion region 43 in the DRAM array 24 to form the array gates 42. In the next step, polysilicon array gate conductor regions 44 are deposited on each deep trench 32, and their top surfaces are recessed using known etching methods. Elsewhere in the DRAM array 24, a BOX layer 14 covers each of the diffusion regions 43. A silicon oxynitride (SiON) layer 46 may grow on the upper surface of the nitride polish stop 20 during the various oxidation steps. A vertical nitride or polysilicon spacer 47 may build up between the DRAM array region 24 and the bulk region 26 during the various deposition and etch steps.

Figure 5:
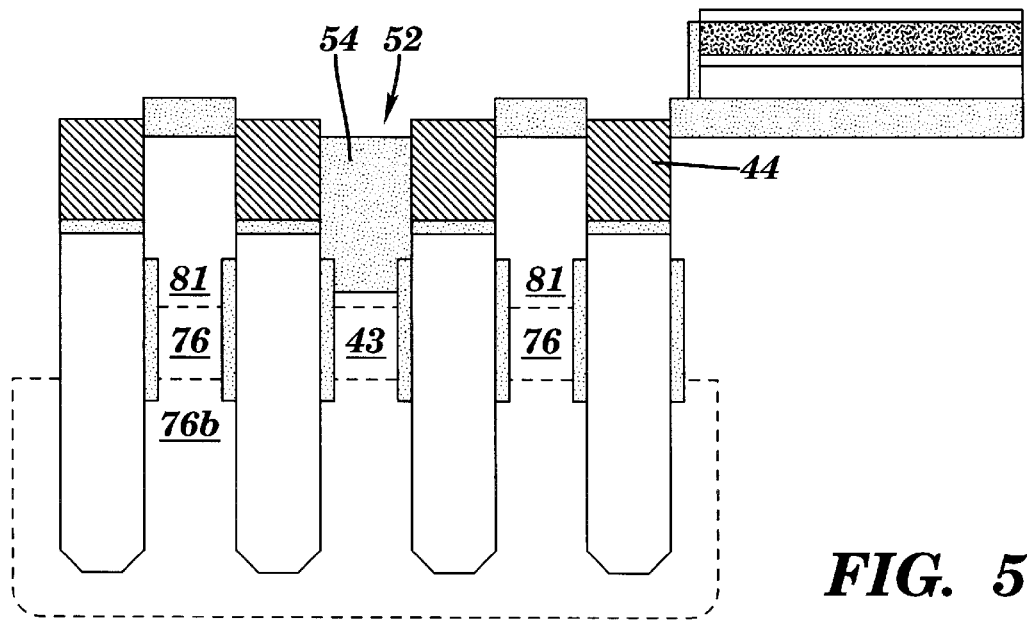
FIG. 5 is a cross-sectional schematic of a fifth step in practicing the method of the present invention.

Next, the active areas in the DRAM array are defined. Referring to FIG. 5, conventional lithography and etching techniques are employed to define shallow isolation trenches 52 in certain of the diffusion regions 43 in the DRAM array 24. A fill material 54, typically silicon dioxide, is deposited into the shallow trench 52. The surface of the filled shallow trench 52 is planarized using standard methods (i.e., a chemical mechanical polish ("CMP")). Next, the surface of the filled shallow trench 52 is again recessed or etched back to uncover the gate polysilicon 44 in the DRAM array area 24.

In an alternative embodiment, the shallow trench isolation can be formed simultaneously in logic regions. This approach requires an extra blockout mask to protect the shallow trench isolation in the logic regions during the oxide recess etch step in the DRAM array. However, this step avoids the requirement of using an extra mask to pattern the shallow trench isolation in the logic regions.

Figure 6:
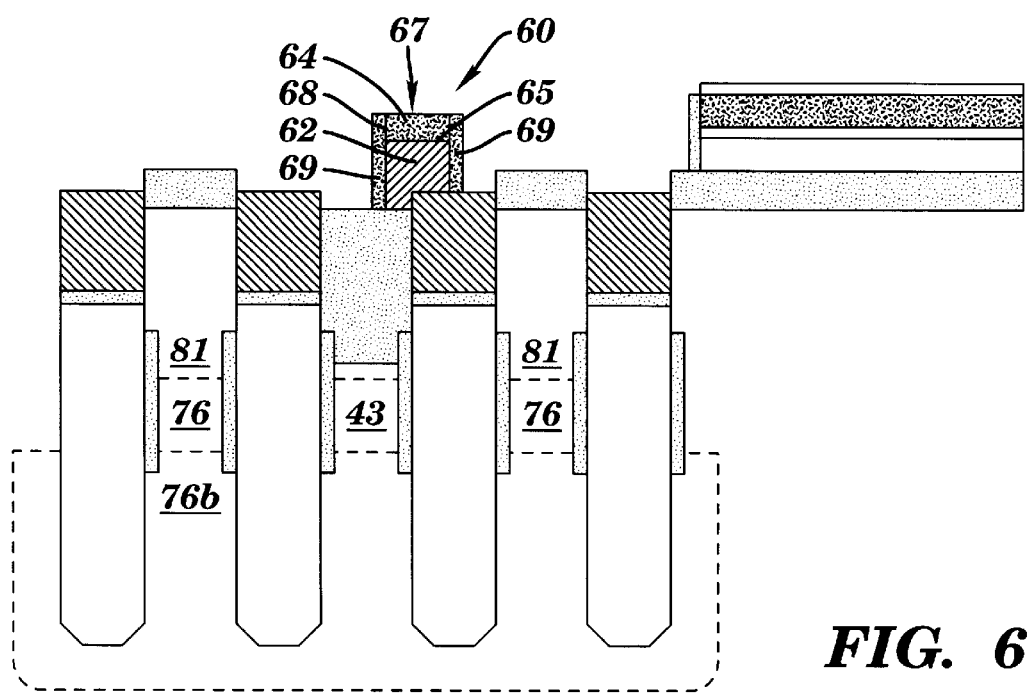
FIG. 6 is a cross-sectional schematic of a sixth step in practicing the method of the present invention.

Now to the step of forming the wordline conductors 60. Wordline conductors 60 are address or data lines which are useful in reducing the overall pin count of the chip, thereby aiding in miniaturization. Referring to FIG. 6, a polycide gate stack 67 is shown which represents a portion of the wordline conductor 60, shown in cross section. The polycide gate stack 67 is constructed when a layer of doped polysilicon 62 is deposited, followed by a layer of tungsten silicide ("WSi$_2$") 68, and a layer of silicon nitride ("SiN") 64. Alternatively, any other refractory-metal silicide may be substituted for the tungsten silicide. The combination of the tungsten (i.e., metal) silicide layer 68 over the polysilicon layer 62 produces a composite layer known as a polycide layer 65. These layers 65, 66, are patterned using known lithography techniques and reactive ion etching ("RIE"), to define the polycide gate stack 67. Then, silicon nitride spacers 69 are formed on the sides of the polycide gate stack 67 which forms the wordline 60.

Figure 7:
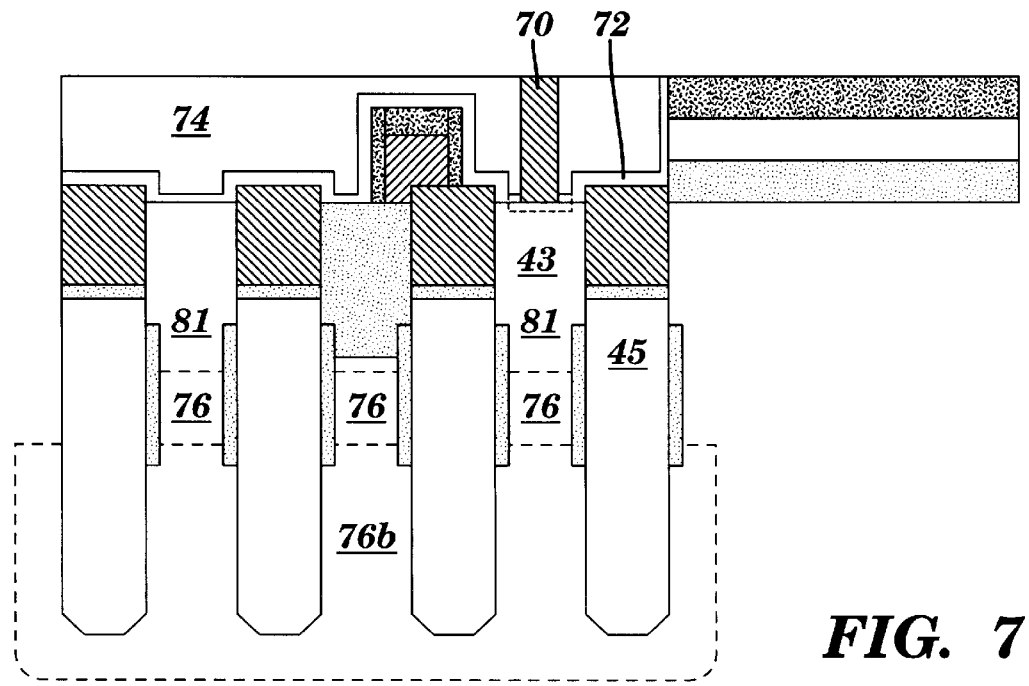
FIG. 7 is a cross-sectional schematic of a seventh step in practicing the method of the present invention.
Figure 8:
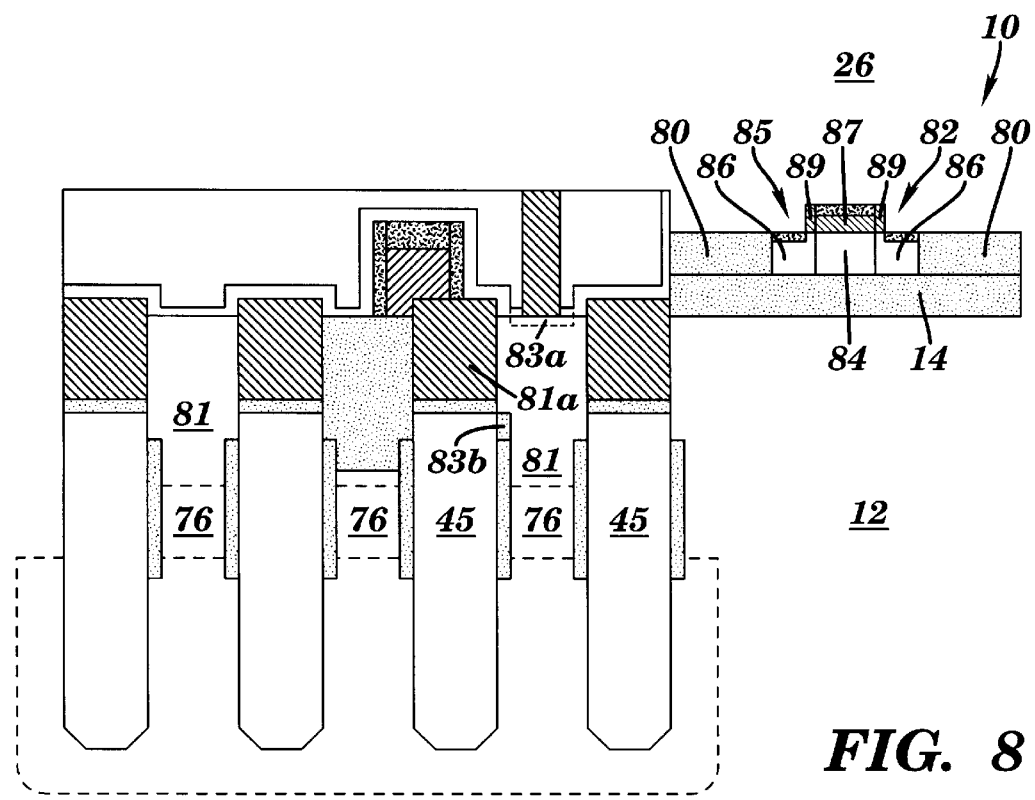
FIG. 8 is a cross-sectional schematic of an eighth and final step in practicing the method of the present invention.

As depicted in FIGS. 7 and 8, the BOX layer 14 is removed from selected diffusion regions 43. Shallow n-type diffusions 83a, 83b are formed within the deeper p-type well 81. Node diffusion is formed by out-diffusion of n-type (e.g., arsenic, phosphorous) dopant from the trench polysilicon 45. These p- and n-type regions form the necessary elements in the DRAM array MOSFET, including the bitline diffusion 83a, the node diffusion 83b, and the transfer device channel 81a.

Then, contacts 70 (FIG. 7) to the DRAM array 24 are formed by initially depositing a silicon nitride layer 72 over the entire DRAM array region 24. Next, a borophosphosilicate glass ("BPSG") layer 74 is deposited over the DRAM array region 24. The BPSG layer 74 is then planarized with a chemical-mechanical polish ("CMP") step. Array contacts 70 can now be formed which provide electrical communication to the diffusion regions 43. The array contact openings are formed using known techniques of lithography and reactive ion etching ("RIE"). A doped polysilicon layer is then deposited and patterned by CMP, forming the array contacts 70.

Turning now to the SOI region 26 of the substrate 10, and referring to FIG. 8, the formation of a typical logic device 82 begins with the forming of shallow trench isolations 80 in the SOI area 26. The shallow trench isolations 80 are filled with a layer of silicon dioxide 81. A p-type silicon well 84 is formed within some of the remaining silicon islands. A gate polysilicon stack 87 is also formed upon the p-type silicon well 84. The gate polysilicon stack 87 is further bounded by insulative spacers 89. Diffusion junctions 86 are formed in the p-type silicon well 84 by introducing n-type dopants into the silicon. Junctions are also formed in the n-type silicon wells by introducing p-type dopants into the silicon. Finally, the gate polysilicon stack 87 and the diffusions 86 are covered by a silicide layer 85, such as cobalt silicide (CoSi$_2$).

The final stage of manufacturing, which is not illustrated here, involves such conventional finishing steps as depositing a silicon nitride layer, and a layer of phosphosilicate glass ("PSG") and planarizing; forming metal (e.g., tungsten) studs to the gates and the diffusions in the logic region, and to the array contacts in the DRAM array; forming bitlines and local interconnects, possibly with a dual-damascene process,; and forming any remaining necessary interconnects.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming a semiconductor apparatus, comprising the steps of:
   (a) providing a single crystalline substrate having a substantially planar surface;
   (b) forming a silicon-on-insulator region on a first surface area of said planar surface;
   (c) forming a single crystalline bulk region on a second surface area of said planar surface;
   (d) forming embedded logic devices in said silicon-on-insulator region;
   (e) forming embedded memory devices in said single crystalline bulk region; and
   (f) forming doped polysilicon-filled trenches in the single crystalline bulk region.

2. The method of forming a semiconductor apparatus of claim 1, wherein the single crystalline substrate is a silicon wafer.

3. The method of forming a semiconductor apparatus of claim 1, wherein the trenches are formed from buried oxide mask.

4. The method of forming a semiconductor apparatus of claim 1, wherein the trenches are formed for isolation.

5. The method of forming a semiconductor apparatus of claim 1, wherein the trenches are formed for storage.

6. The method of forming a semiconductor apparatus of claim 1, wherein the embedded memory devices in the single crystalline region are DRAM devices.

7. The method of forming a semiconductor apparatus of claim 4, wherein the trenches in the first surface area form shallow trench isolation regions.

8. The method of forming a semiconductor apparatus of claim 5, wherein the trenches in the second surface area form deep trench storage regions.

9. The method of forming a semiconductor apparatus of claim 7, wherein the shallow trench isolations are formed in the region containing the embedded logic devices.

* * * * *